(12) United States Patent
Miglani et al.

(10) Patent No.: US 10,601,438 B2
(45) Date of Patent: Mar. 24, 2020

(54) ALTERNATELY UPDATED DIGITAL TO ANALOG CONVERTERS

(71) Applicant: TEXAS INSTRUMENTS INCORPORATED, Dallas, TX (US)

(72) Inventors: Eeshan Miglani, Chhindwara (IN); Visvesvaraya Appala Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/434,526

(22) Filed: Jun. 7, 2019

(65) Prior Publication Data

US 2019/0379391 A1 Dec. 12, 2019

(30) Foreign Application Priority Data

Jun. 7, 2018 (IN) .............................. 201841021256

(51) Int. Cl.
| | | |
|---|---|---|
| *H04B 1/00* | (2006.01) | |
| *H04B 10/556* | (2013.01) | |
| *H03M 3/00* | (2006.01) | |
| *H04B 1/40* | (2015.01) | |
| *H03K 19/21* | (2006.01) | |

(52) U.S. Cl.
CPC ............ *H03M 3/464* (2013.01); *H03M 3/422* (2013.01); *H03M 3/498* (2013.01); *H04B 1/40* (2013.01); *H03K 19/21* (2013.01)

(58) Field of Classification Search
CPC ...... H03M 3/464; H03M 3/498; H03M 3/422; H04B 1/40; H04B 10/556; H04B 10/5563; H04B 1/0014; H04B 1/0039; H03K 19/21; H04L 7/0331
See application file for complete search history.

(56) References Cited

U.S. PATENT DOCUMENTS

| | | | | |
|---|---|---|---|---|
| 4,339,770 A | * | 7/1982 | Dennison | H04N 9/896 348/498 |
| 5,532,820 A | * | 7/1996 | Strolle | H04N 9/797 386/307 |
| 5,703,585 A | * | 12/1997 | Lamm | H03K 17/76 341/141 |
| 7,167,119 B1 | * | 1/2007 | Lei | H03M 3/342 341/143 |

(Continued)

OTHER PUBLICATIONS

"Analog-to-Digital converter." Wikipedia, http://en.wikipedia.org/wiki/Analog-to-digital_converter#-Sigma-delta. Retrieved on May 28, 2019. pp. 1-14.

(Continued)

*Primary Examiner* — Andrew Wendell
(74) *Attorney, Agent, or Firm* — John R. Pessetto; Charles A. Brill; Frank D. Cimino

(57) ABSTRACT

A modulator of an analog to digital converter includes a quantizer component configured to generate a digital signal based on a clock input operating at a sample rate. The modulator further includes a first digital to analog converter (DAC) configured to generate first DAC output at half the sample rate. The modulator further includes a second DAC configured to generate second DAC output at half the sample rate, where the first DAC and the second DAC are updated at alternate cycles of the clock input.

22 Claims, 4 Drawing Sheets

(56) References Cited

U.S. PATENT DOCUMENTS

| | | | | |
|---|---|---|---|---|
| 7,365,667 B1* | 4/2008 | Nanda | ................ | H03M 3/32 |
| | | | | 341/143 |
| 2005/0085194 A1* | 4/2005 | Robinson | ................ | H03M 3/50 |
| | | | | 455/91 |
| 2005/0110668 A1* | 5/2005 | Chin | ................ | H03M 1/822 |
| | | | | 341/152 |
| 2005/0258992 A1* | 11/2005 | Fontaine | ................ | H03M 1/662 |
| | | | | 341/144 |
| 2014/0285368 A1* | 9/2014 | Anderson | ................ | H03M 3/464 |
| | | | | 341/143 |
| 2015/0358029 A1* | 12/2015 | Wang | ................ | H03M 3/37 |
| | | | | 341/143 |
| 2018/0115328 A1* | 4/2018 | Kuan | ................ | H04B 1/001 |

OTHER PUBLICATIONS

Baker, Bonnie. "How delta-sigma ADCs work, Part 1." Texas Instruments Incorporated. Analog Applications Journal, 3Q 2011. 6 pages.

Baker, Bonnie. "How delta-sigma ADCs work, Part 2." Texas Instruments Incorporated. Analog Applications Journal, 4Q 2011. 5 pages.

Pearson, Chris. "High-Speed, Analog-to-Digital Converter Basics." Texas Instruments, Application Report, SLAA510—Jan. 2011, pp. 1-26.

* cited by examiner

ALTERNATELY UPDATED DIGITAL TO ANALOG CONVERTERS

CROSS-REFERENCE TO RELATED APPLICATIONS

This application claims priority to India Provisional Application No. 201841021256, filed Jun. 7, 2018, which is hereby incorporated by reference.

BACKGROUND

Analog to digital converters (ADCs) are used in many devices to convert analog signals to digital signals. For example, a wireless electronic device may include an ADC configured to convert received radio frequency signals to digital signals.

Various types of ADCs are implemented in devices today. One type of ADC is known as a delta-sigma ADC. A delta-sigma ADC oversamples an input analog signal to generate an output signal The delta-sigma ADC further includes a feedback path in which the output signal is converted into a feedback analog signal by a digital to analog converter (DAC), and the feedback analog signal is subtracted from the input analog signal to noise shape the input analog signal. This noise shaping function may result in noise in the input analog signal being pushed to higher frequencies. As the noise is moved outside of a band of interest, the sigma-delta may more accurately convert the input analog signal. However, delta-sigma ADCs may be sensitive to various factors, such as clock jitter, dynamic error (e.g., caused in variance in component characteristics), and excess loop delay.

SUMMARY

Delta-sigma analog to digital converters (ADCs) that include alternately updated (e.g., updated at alternate clock cycles) digital to analog converters (DACs) are disclosed. Such delta-sigma ADCs may have reduced sensitivity to clock jitter, dynamic error, excess loop delay, or a combination thereof as compared to other delta-sigma ADCs.

A modulator of an analog to digital converter includes a quantizer component configured to generate a digital signal based on a clock input. The modulator further includes a first digital to analog converter (DAC) configured to generate first DAC output including pulses as wide as two pulses of the clock input. The modulator further includes a second DAC configured to generate second DAC output including pulses as wide as two pulses of the clock input, where the first DAC and the second DAC are updated at alternate cycles of the clock input.

A modulator of an analog to digital converter includes a quantizer component configured to generate a digital signal based on a clock input operating at a sample rate. The modulator further includes a first digital to analog converter (DAC) configured to generate first DAC output at half the sample rate. The modulator further includes a second DAC configured to generate second DAC output at half the sample rate, where the first DAC and the second DAC are updated at alternate cycles of the clock input.

A transceiver includes a receiver and an analog digital converter (ADC) coupled to the receiver. The ADC includes a modulator component. The modulator component includes a quantizer component configured to generate a digital signal based on a clock input operating at a sample rate. The modulator component further includes a first digital to analog converter (DAC) configured to generate first DAC output at half the sample rate. The modulator component further includes a second DAC configured to generate second DAC output at half the sample rate, where the first DAC and the second DAC are updated at alternate cycles of the clock inpu.

BRIEF DESCRIPTION OF THE DRAWINGS

For a detailed description of various examples, reference will now be made to the accompanying drawings in which.

DETAILED DESCRIPTION

Figure 1:
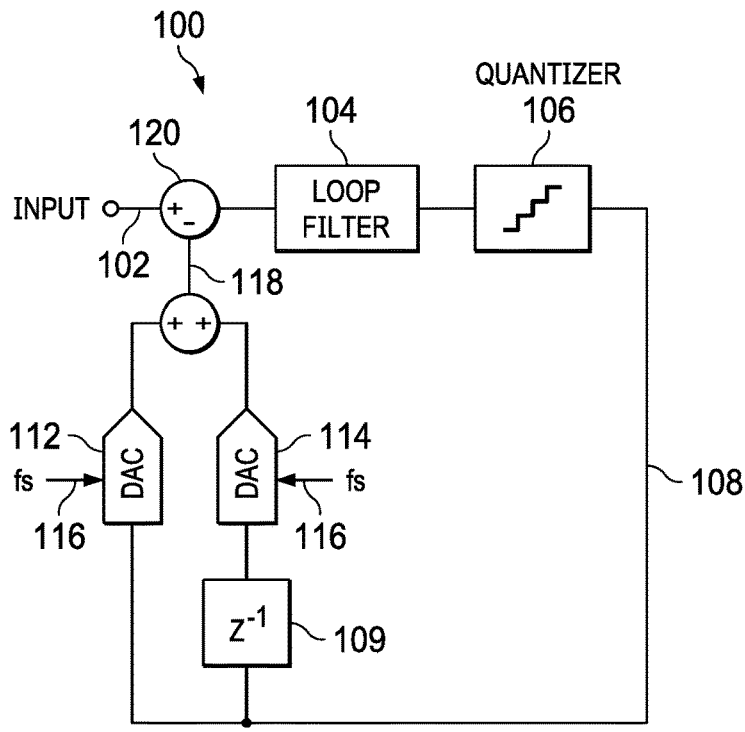
FIG. 1 illustrates a diagram of a modulator component of a prior art delta-sigma ADC for reducing sensitivity to clock jitter.

As signal bandwidths increase, delta-sigma analog to digital converter (ADC) sampling frequency (fs) increase. However, as the fs of an ADC increases, sensitivity of the ADC to clock jitter and dynamic error from digital to analog converter (DAC) components increases. Referring to FIG. 1, a diagram of a modulator component 100 of a prior art delta-sigma ADC for reducing sensitivity to clock jitter is illustrated. The modulator component 100 is configured to generate a digital signal 108 based on a received input analog signal 102 at a sampling frequency (fs) 116. The fs 116 is greater than an output rate (fd) of the delta-sigma ADC. While not illustrated, the ADC may further include a digital decimation component configured to receive the digital signal 108 at the fs 116 and to output a digital signal at the fd of the delta-sigma ADC.

The modulator component 100 of the prior art delta-sigma ADC includes a difference amplifier 120 configured to output a difference between the input analog signal 102 and a feedback analog signal 118. A loop filter 104 receives the difference and outputs a filtered signal based on a sign and magnitude of the difference. A quantizer 106 receives output from the loop filter 104 and generates the digital signal 108 by comparing the output of the loop filter 104 to a reference voltage. The quantizer generates the digital signal 108 at the fs 116. For each sample n of the input analog signal 202, the quantizer 206 drives the digital signal 208 to a digital value out[n].

A first DAC 112 receives the digital signal 108 at the fs 116 and generates first DAC output based on the digital signal 108. While not illustrated, a storage device (e.g., a flip-flop) introduces a delay to the digital signal 108. Accordingly, for each digital value out[n] of the digital signal 108, the first DAC 112 receives out[[n−1] and generates a first DAC output signal corresponding to analog of out[n−1]. A second DAC 114 receives a further delayed version of the digital signal 108 from a unit delay device 109 and generates second DAC output based on the delayed version. Accordingly, for each digital value out[n] of the digital signal 108, the second DAC 114 receives out[n−2] and generates a second DAC output signal corresponding to analog of out[n−2]. The feedback analog signal 118 includes a sum of the first DAC output and the second DAC output. Thus, for each sample n of the input analog signal 102, the analog signal 118 corresponds to analog of out[n−1]+out[n−2], where n is the current sample. In the frequency domain, this corresponds to $out[z]*z^{-1}(1+z^{-1})$. As explained above, the difference amplifier 120 is configured to output a difference between the input analog signal 102 and a feedback analog signal 118. Accordingly, higher frequencies are reduced in power in the feedback analog signal 118. Thus, using output from the first DAC 112 and the second DAC 114 to generate the feedback analog signal 118 introduces an analog finite impulse response (AFIR) filter effect reducing effects of clock jitter on the digital signal 108. However, the modulator component 100 may introduce more dynamic error as compared to modulators that include one DAC. For example, dynamic error may be introduced into the feedback analog signal 118 by mismatch in transistor threshold voltages and/or timings within one of the DACs 112, 114. Accordingly, operating two DACs at the fs 116 to generate the feedback analog signal 118 may compound dynamic error because an additional DAC is used and because transistors between the two DACs 112, 114 may vary.

Figure 2:
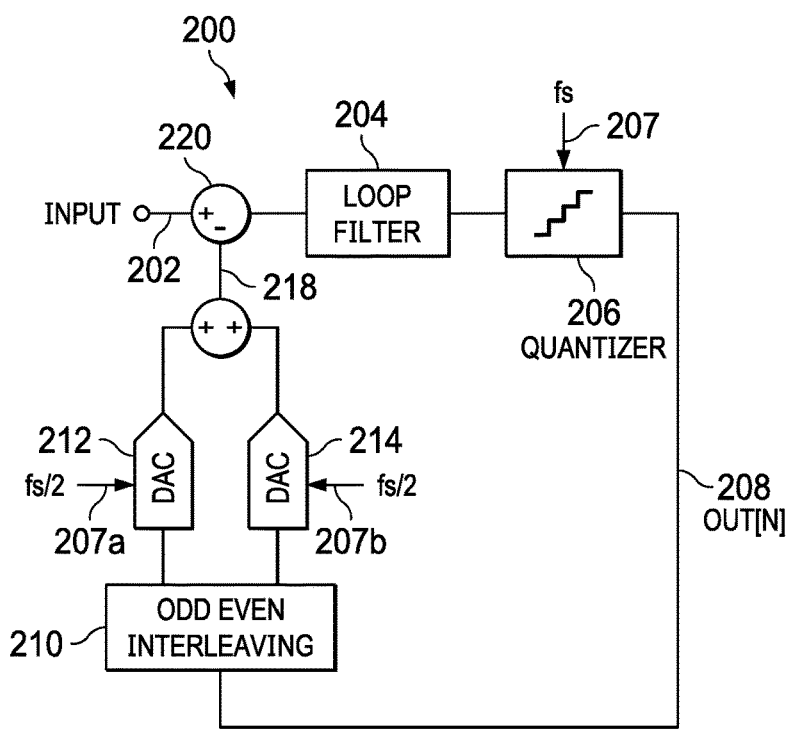
FIG. 2 illustrates a first diagram of a modulator component including alternately updated DACs.

Referring to FIG. 2, a first diagram of a modulator component 200 including alternately updated DACs is illustrated. The modulator 200 is configured to generate a digital signal 208 at fs based on a received input analog signal 202. The fs is greater than fd of a delta-sigma ADC that includes the modulator 200. While not illustrated, the ADC may include a digital decimation component configured to receive the digital signal 208 at the fs and to output a digital signal at the fd of the delta-sigma ADC.

The modulator component 200 includes a difference amplifier 220 configured to output a difference between the input analog signal 202 and a feedback analog signal 218. A loop filter 204 receives the difference and outputs a filtered signal based on a sign and magnitude of the difference. For example, the loop filter 204 may include one or more integrators, one or more accumulators, or a combination thereof. A quantizer 206 receives output from the loop filter 204 and generates the digital signal 208 by comparing the output of the loop filter 204 to a reference voltage. To illustrate, the quantizer 206 may include a comparator configured to receive the reference voltage and the output of the loop filter 204. The quantizer 206 generates the digital signal 208 at the sampling frequency fs based on clock input 207. For each sample n of the input analog signal 202, the quantizer 206 drives the digital signal 208 to a digital value out[n]. In some examples, the quantizer 206 may correspond to interleaved quantizers each operating at a fraction of the fs where a sum of clocks input to the interleaved quantizers corresponds to the clock input 207.

The digital signal 208 is received by odd even interleaving circuitry 210 configured to transmit the digital signal 208 to a first DAC 212 on odd clock pulses of the clock input 207 and to transmit the digital signal 208 to a second DAC 214 on even clock pulses of the clock input 207. For example, the odd even interleaving circuitry 210 may provide values of the digital signal 208 corresponding to odd pulses of the clock input 207 to the first DAC 212 and may provide values of the digital signal 208 corresponding to even clock pulses of the clock input 207 to the second DAC 214. Thus, the DACs 212, 214 may transition at a rate of half fs. Further, pulses generated by each of the DACs 212, 214 may have a width of two pulses of the clock input 207. The feedback analog signal 218 is a sum of the first DAC output and the second DAC output. For odd clock pulses, the first DAC 212 receives out[n−1] and outputs analog of out[n−1], and the second DAC 212 receives out[n−2] and outputs analog of out[n−2]. For even clock pulses, the first DAC 212 receives out[n−2] and outputs analog of [n−2], and the second DAC 212 receives out[n−1] and outputs analog of out[n−1]. Thus, the feedback analog signal 218 corresponds to analog of (out[n−1]+out[n−2]) for both even and odd pulses of the clock input 207. As explained above, the difference amplifier 220 is configured to output a difference between the input analog signal 102 and a feedback analog signal 218.

Because each of the DACs 212, 214 generates a pulse corresponding to two clock pulses (e.g., analog of (out[n−1]+out[n−2])), the feedback analog signal 218 generates an analog finite impulse response (AFIR) filter effect reducing effects of clock jitter on the digital signal 208. Further, the modulator 200 may introduce less dynamic error as compared to the modulator component 100 because the DACs 212, 214 are operated at half the fs of the modulator 200. This is because transistors in the DACs 212, 214 transition half as frequently as they would if both the DACs 212, 214 were operated at fs. Thus, variance in properties of the transistors of the DACs 212, 214 may affect the digital signal 208 less. Further, the modulator 200 may consume less power as compared to examples in which two DACs are operated at fs.

Figure 3:
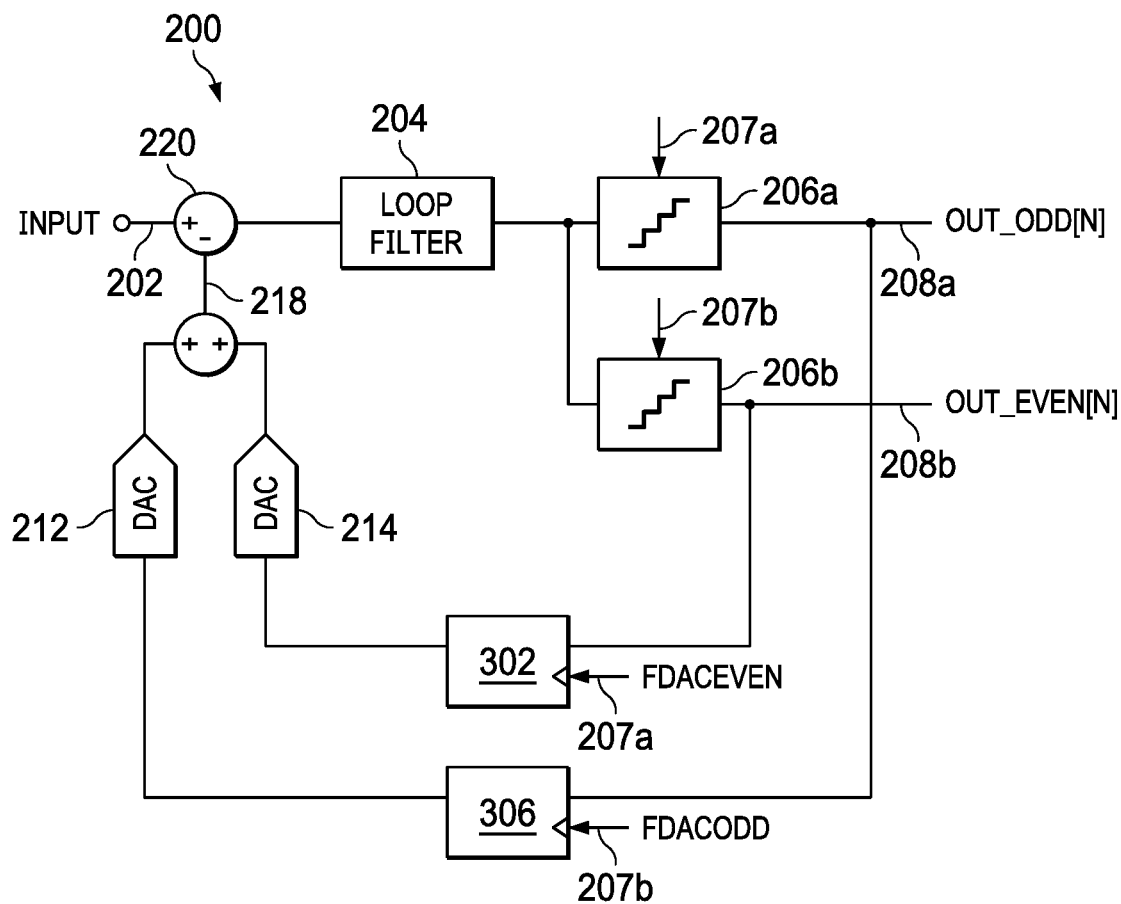
FIG. 3 illustrates a second diagram of the modulator component including alternately updated DACs showing additional detail of a quantizer and odd even interleaving circuitry.

Referring to FIG. 3, a second diagram of the modulator component 200 showing additional detail of the quantizer 206 and the odd even interleaving circuitry 210 is illustrated. As illustrated, the quantizer 206 may include a first quantizer 206a and a second quantizer 206b. The first quantizer 206a is configured to generate odd digital signal 208a based on the odd clock 207a, and the second quantizer 206b is configured to generate even digital signal 208b based on the even clock 207b. The digital signal 208 may correspond to a combination of the odd digital signal 208a and the even digital signal 208b and the clock input 207 may correspond to a sum of the odd clock 207a and the even clock 207b.

In the illustrated example, the odd even interleaving circuitry 210 includes an even flip-flop device 302 and an odd flip-flop device 306. The even flip-flop device 302 receives the even digital signal 208b from the second quantizer 206b and is clocked by an even clock signal 304 (the second quantizer 206b may also be clocked by the even clock signal 304). The even clock 207b corresponds to a half fs clock signal that includes even pulses of the clock of the modulator component 200 (e.g., the clock input 207). Thus, output of the even flip-flop device 302 is updated on even clock pulses. On even clock pulses, the even flip-flop device 302 outputs out[n−1] and on odd clock pulses, the even flip-flop device 302 outputs out[n−2]. The second DAC 214 receives the output of the even flip-flop device 302. Accordingly, the second DAC 214 operates at half fs and generates pulses that are as wide as two pulses of the clock input 207. The odd flip-flop device 306 receives the odd digital signal 208a from the first quantizer 206a and is clocked by the odd clock 207a. The odd clock 207a corresponds to a half fs clock signal that includes odd pulses of the clock of the modulator component 200. Thus, output of the odd flip-flop device 306 is updated on even clock pulses. On even clock pulses, the odd flip-flop device 306 outputs out[n−2] and on odd clock pulses, the odd flip-flop device 306 outputs out[n−1]. The first DAC 212 receives the output of the odd flip-flop device 306. Accordingly, the first DAC 212 operates at half fs and generates pulses that are as wide as two pulses of the clock input 207 of the modulator component 200. Output of the first DAC 212 and the second DAC 214 may correspond to a non-return to zero signal. Non-return to zero signals may be less sensitive to jitter.

Thus, the example illustrated in FIG. 3 may provide the benefits described above with respect to FIG. 2. Further, the flip-flop devices 302, 306 operate at half fs instead of fs. Accordingly, the flip-flop devices 302, 306 may consume less power as compared to examples in which two DACs receive input from two flip-flop devices operating at fs. Further, clocking distortions associated with the flip-flop devices 302, 306 may be reduced because the flip-flop devices 302, 306 transition less frequently. Accordingly, the modulator component 200 illustrated in FIG. 3 may introduce less error and consume less power as compared to other modulator components included in delta-sigma ADCs.

As sample rates in ADCs increase, excess loop delay (ELD) becomes more important to correct. ELD refers to delay in a modulator updating an output signal in response to a feedback loop.

Figure 4:
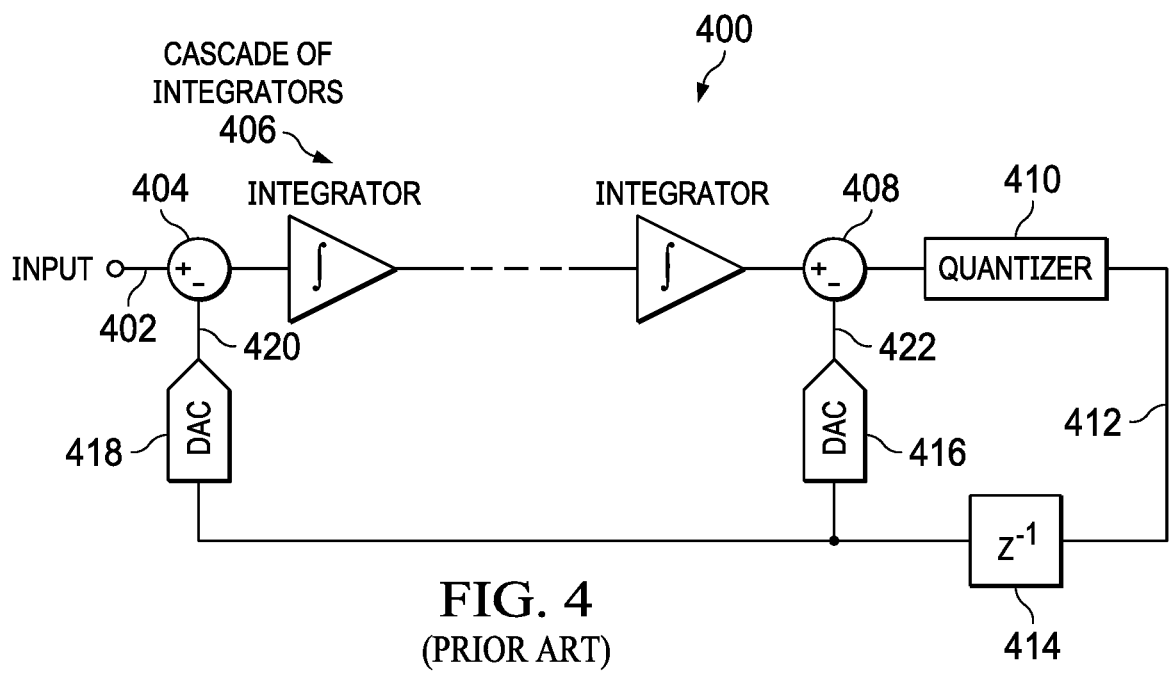
FIG. 4 illustrates a first example of a prior art modulator component configured to reduce ELD.

Referring to FIG. 4, a first example of a prior art modulator component 400 configured to reduce ELD is shown. The modulator component 400 is configured to generate a digital signal 412 at fs based on a received input analog signal 402. The fs is greater than fd of a delta-sigma ADC that includes the modulator component 400. While not illustrated, the ADC may include a digital decimation component configured to receive the digital signal 412 at the fs and to output a digital signal at the fd of the delta-sigma ADC.

The modulator component 400 includes a difference amplifier 404 configured to output a difference between the input analog signal 402 and a first feedback analog signal 420. A cascade 406 of integrators receives the difference and outputs an integrated signal based on a sign and magnitude of the difference. The modulator component 400 further includes a quantizer 410 configured to receive input based on output of the cascade 406 of integrators. The quantizer 410 generates the digital signal 412 by comparing its input to a reference voltage. The quantizer 410 receives a clock signal and generates the digital signal 412 at the fs. A unit delay component 414 delays the digital signal 412. A first DAC 418 receives the delayed digital signal 412 at the fs and generates the first feedback analog signal 420 based on the delayed digital signal 412. Accordingly, the output of the first DAC 418 provides feedback that adjusts output of the modulator component 400. However, each integrator in the cascade 406 introduces ELD which delays the first feedback analog signal 420 from affecting the digital signal 412.

The modulator component 400 includes a second DAC 416 and a high bandwidth summer 408 that function as an ELD compensation component. The second DAC 416 receives the delayed digital signal 412 from the unit delay element 414 and outputs a second analog feedback signal 422. The high bandwidth summer 408 combines the second analog feedback signal 422 with output of the cascade 406 of integrators prior to the quantizer 410 receiving the output of the cascade 406. Accordingly, ELD due to the cascade 406 of integrators may be reduced. However, the high bandwidth summer 408 may consume significant power.

Figure 5:
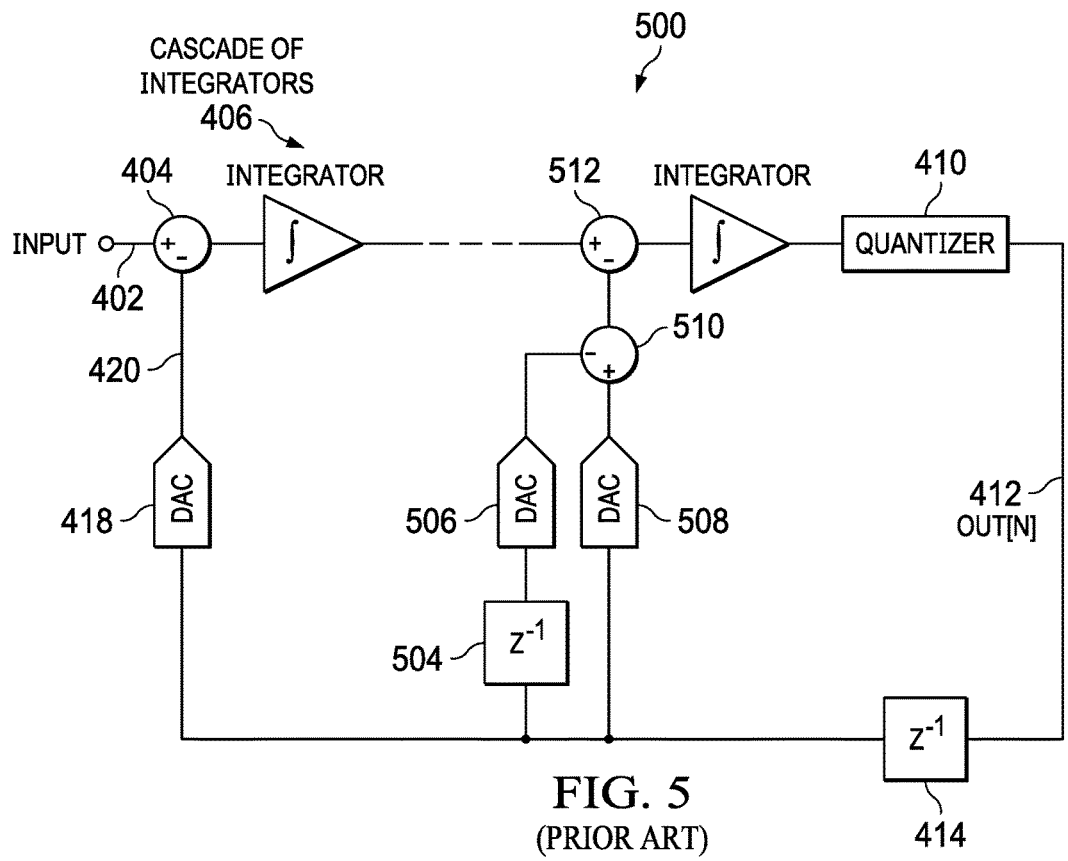
FIG. 5 illustrates a second example of a prior art modulator component configured to reduce ELD.

Referring to FIG. 5, a second example of a prior art modulator component 500 configured to reduce ELD is shown. The prior art modulator component 500 includes the same components as the prior art modulator 500 except the prior art modulator component 500 includes an analog finite impulse response (AFIR) filter prior to a last integrator of the cascade 406 in place of the high bandwidth summer 408 and the second DAC 416.

The AFIR filter includes a third DAC 508 configured to receive the delayed digital signal 412 from the unit delay element 414. The delay introduced by the unit delay element 414 may correspond to half a clock cycle. Thus, for each sample n of the input analog signal 402, the third DAC 508 receives a digital value, out[n]. The AFIR filter further includes a second unit delay element 504 configured to receive the delayed digital signal 412 and further delay the signal. A fourth DAC 506 receives the further delayed signal 412. Thus, for each sample n of the input analog signal 402, the fourth DAC 506 receives a digital value, out[n−1], of a previous sample. The third DAC 508 and the fourth DAC 506 generate output at the fs based their respective received inputs. A difference in outputs of the third DAC 508 and the fourth DAC 506 is output by a second differential amplifier 510. For each sample n, the difference output by the second differential amplifier 510 corresponds to analog of (out[n]−out[n−1]). A difference between the the output of the second differential amplifier 510 and a signal in the cascade 406 of integrators is output by a third differential amplifier 512. The output of the third differential amplifier 512 is received by the final integrator in the cascade 406 and integrated into input for the quantizer 410. The modulator component 500 does not include a high bandwidth summer because the final integrator is located after the output of the AFIR filter. However, the modulator component 500 may introduce noise into the output digital signal 412 due to variance in components (e.g., transistors) of the third DAC 508 and the fourth DAC 506.

Figure 6:
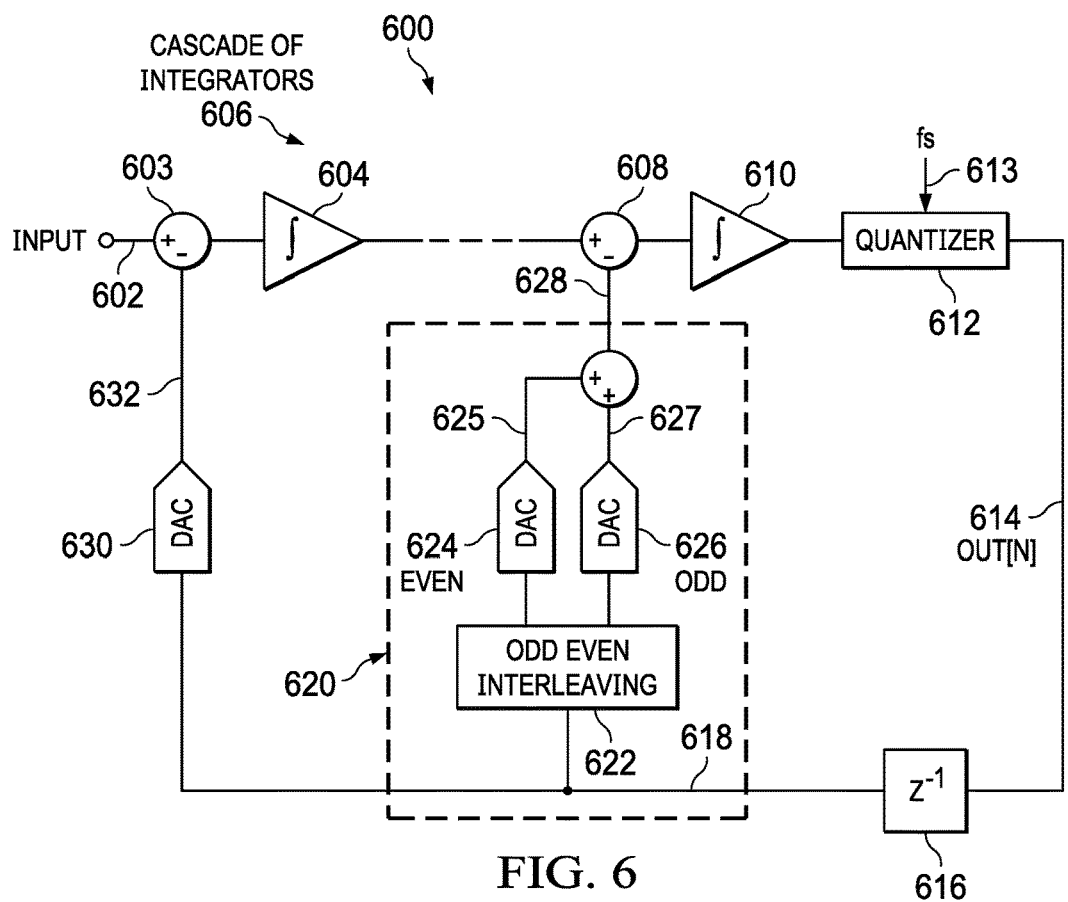
FIG. 6 illustrates a modulator component including alternately updated DACs configured to reduce ELD.

Referring to FIG. 6, a diagram illustrating a modulator component 600 including alternately updated DACs configured to reduce ELD is shown. The modulator 600 is configured to generate a digital signal 614 at sampling frequency fs based on a received input analog signal 602. The fs is greater than an output rate fd of a delta-sigma ADC that includes the modulator 600. While not illustrated, the ADC may include a digital decimation component configured to receive the digital signal 614 at the fs and to output a digital signal at the fd of the delta-sigma ADC.

The modulator component 600 includes a first difference amplifier 603 configured to output a difference between the input analog signal 602 and a first feedback analog signal 632. A first integrator 604 of a cascade 606 of integrators receives the difference and outputs an integrated signal based on a sign and magnitude of the difference. The modulator component 600 further includes a quantizer 612 configured to receive input based on output of a second integrator 610 of the cascade 606 of integrators. The quantizer 612 generates the digital signal 614 by comparing its input to a reference voltage. The quantizer 612 receives a clock input 613 that drives the quantizer 612 to generate the digital signal 614 at the fs. A unit delay component 616 delays the digital signal 614 (e.g., by one clock cycle) generating a delayed digital signal 618. A first DAC 630 receives the delayed digital signal 618 at the fs and generates the first feedback analog signal 632 based on the delayed digital signal 618. As described above, the first difference amplifier 603 provides input to the cascade 606 of integrators corresponding to a difference between the input analog signal 602 and the first feedback analog signal 632. Accordingly, the output of the first DAC 630 provides feedback that adjusts output of the modulator component 600. However, each integrator in the cascade 606 introduces ELD which delays the first feedback analog signal 632 from affecting the digital signal 614.

The modulator component 600 includes an ELD compensation component 620 configured to generate a second analog feedback signal 628 corresponding to a AFIR filter signal. The modulator component 600 includes a second differential amplifier 608 configured to output a difference of a signal in the cascade 606 of integrators and the second analog feedback signal 628 to the second integrator 610. Because the AFIR filter signal is applied before the second integrator 610, the modulator component 600 may not include a high speed summer to incorporate the second analog feedback signal 628. Further, the ELD compensation component 620 may reduce ELD by providing the second analog feedback signal 628 that bypasses integrators included in the chain 606 of integrators. In some implementations, the DAC outputs 627, 625, are summed by a opamp that includes the second differential amplifier 608 and the second integrator 610.

The ELD compensation component 620 includes odd even interleaving circuitry 622, an odd DAC 626, and an even DAC 624. The even DAC 624 and the odd DAC 626 may correspond to highpass DACs that generate data based on a digital signal on high clock pulses. The odd even interleaving circuitry 622 is configured to provide odd values (e.g., values corresponding to odd clock signals) of the delayed digital signal 618 to the odd DAC 626 on odd clock signals and to provide an opposite of the odd values to the odd DAC 626 between odd clock signals. Further, the odd even interleaving circuitry 622 is configured to provide even values (e.g., values corresponding to even clock signals) of the delayed digital signal 618 to the even DAC 624 on even clock signals and to provide an opposite of the even values to the even DAC 626 between even clock signals. Thus, on odd clock pulses, the odd DAC 626 receives out[n] and the even DAC 624 receives −out[n−1], and on even clock pulses, the odd DAC 626 receives −out[n−1] and the even DAC 624 receives out[n]. The odd DAC 626 generates first DAC output 627 and the even DAC 624 generates second DAC output 625. On odd clock pulses, the first DAC output 627 corresponds to analog of out[n], and the second DAC output 625 corresponds to analog of −out[n−1]. On even clock pulses, the first DAC output 627 corresponds to analog of −out[n−1], and the second DAC output 625 corresponds to analog of out[n]. The first DAC output 627 and the second DAC output 625 are combined to generate the second analog feedback signal 628. Thus, the second analog feedback signal 628 corresponds to analog of (out[n]−out[n−1]) on even and odd clock pulses and is an AFIR filter signal. Further, because the same circuitry (e.g., the even DAC 624 or the odd DAC 626) is used to generate DAC output for each signal value and its opposite, noise due to mismatches in circuitry of the DACs 624, 626 may not be introduced into the second analog feedback signal 628. To illustrate, for an even sample i, analog of out[i] is generated by the even DAC 624 during the clock pulse i and −out[i] is generated by the even DAC 624 during the clock pulse i+1. Because the same components generate analog of out[i] and analog of −out[i], error mismatch may be avoided. Accordingly, the ELD compensation component 620 may result in less noise in input received by the quantizer 612 and the digital signal 614 may be more accurate. Further, because flip-flop devices included in the odd even interleaving circuitry 622 may operate at half speed as compared to implementations in which two DACs are updated every clock cycle, the modulator component 600 may consume less power as compared to other modulator components.

Figure 7:
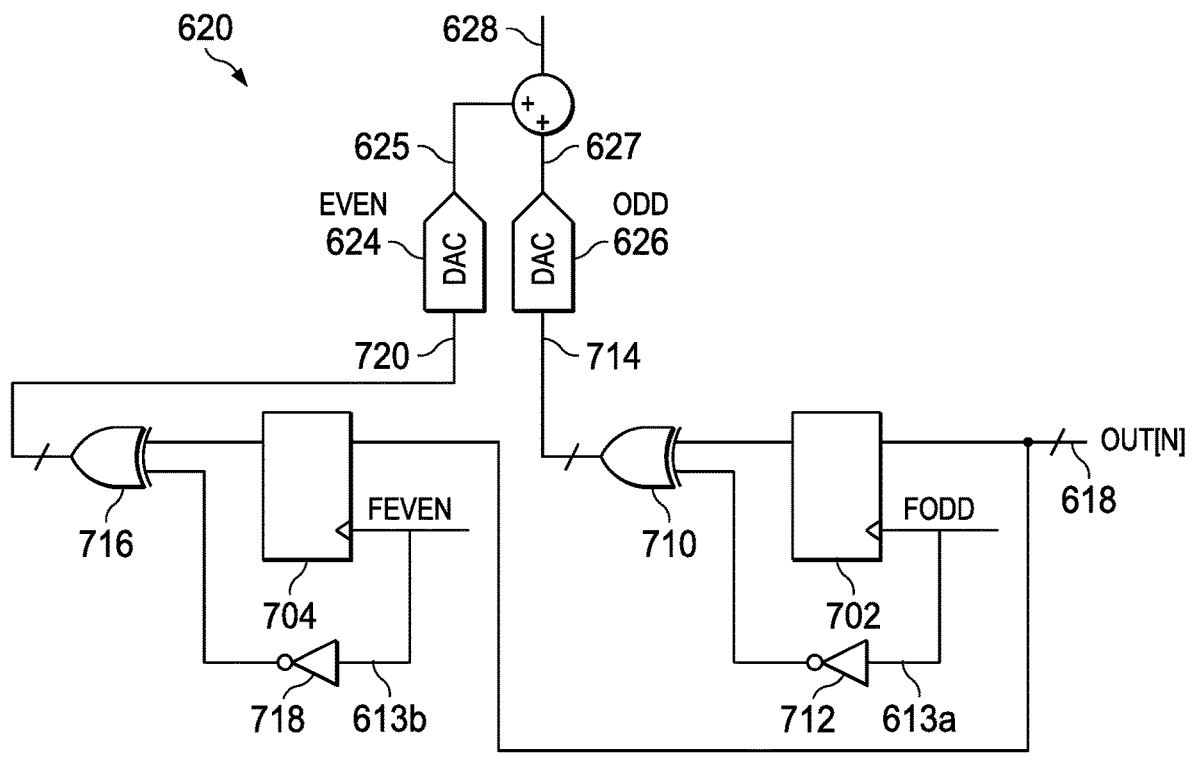
FIG. 7 illustrates additional detail of odd even interleaving circuitry of an ELD compensation component.

FIG. 7 illustrates an example of the ELD compensation component 620 in which an example implementation of the odd even interleaving circuitry 622 is shown. In the example of FIG. 7, a first flip-flop device 702 and a second flip-flop device 704 receive the delayed digital signal 618. The first flip-flop device 702 is clocked by (e.g., configured to replace a stored value based on) an odd clock signal 613a. The odd clock signal 613a corresponds to odd clock pulses of the clock input 613 of the modulator component 600 (e.g., the clock that drives the quantizer 612 at fs). The second flip-flop device 702 is clocked by an even clock signal 613b. The even clock signal 613b corresponds to even clock pulses of the clock input 613. Thus, in operation, the first flip-flop device 702 stores odd values of the digital signal 618 (e.g., out[i], out[i+2], out[i+4], etc., where i is an odd number) generated by the quantizer 612 and the second-flip flop device 704 stores even values of the digital signal 618 (e.g., out[i+1], out[i+3], etc.) generated by the quantizer 612.

A fist exclusive or (XOR) device 710 receives the odd clock signal 613a inverted by a first inverter 712 and output of the first flip-flop device 702. Accordingly, a first XOR output signal 714 generated by the first XOR device 710 indicates the value stored in the first flip-flop device 702 on odd clock pulses (e.g., in response to output of the first inverter 712 corresponding to a low value) and indicates an opposite of the value stored in the first flip-flop device 702 between odd clock pulses (e.g., in response to output of the first inverter 712 corresponding to a high value). In other words, the first XOR output signal 714 corresponds to out[n] on odd clock pulses and corresponds to −out[n−1] on even clock pulses.

A second XOR device 716 receives the even clock signal 613b inverted by a second inverter 718 and output of the second flip-flop device 704. Accordingly, a second XOR output signal 720 generated by the second XOR device 716 indicates the value stored in the second flip-flop device 704 on odd clock pulses (e.g., in response to output of the second inverter 718 corresponding to a low value) and indicates an opposite of the value stored in the second flip-flop device 704 between odd clock pulses (e.g., in response to output of the second inverter 718 corresponding to a high value). In other words, the second XOR output signal 720 corresponds to out[n] on even clock pulses and corresponds to −out[n−1] on odd clock pulses.

The odd DAC 626 receives the first XOR output signal 714 and the even DAC 624 receives the second XOR output signal 720. Accordingly, together the DACs 624, 626 generate analog signals based on each value output by the quantizer 612 and its opposite. Thus, the second analog feedback signal 628 corresponds to analog of (out[n]−out[n−1] at each clock pulse n. In other words, the analog feedback signal 628 corresponds to an AFIR filter signal. Further, because the same DAC circuitry is used to generate DAC output for any given value and its opposite (e.g., both when the value corresponds to out[n] and when the value corresponds to out[n−1]), timing and/or threshold voltage mismatch between components of the DACs 624, 626 may not introduce noise (or may introduce less noise) into the second analog feedback signal 628.

In addition, because the flip-flop devices 702, 704 and DACs 624, 626 operate at rates slower than fs, the modulator component 600 may utilize less power as compared to implementations that use two DACs operating at fs to compensate for ELD.

Figure 8:
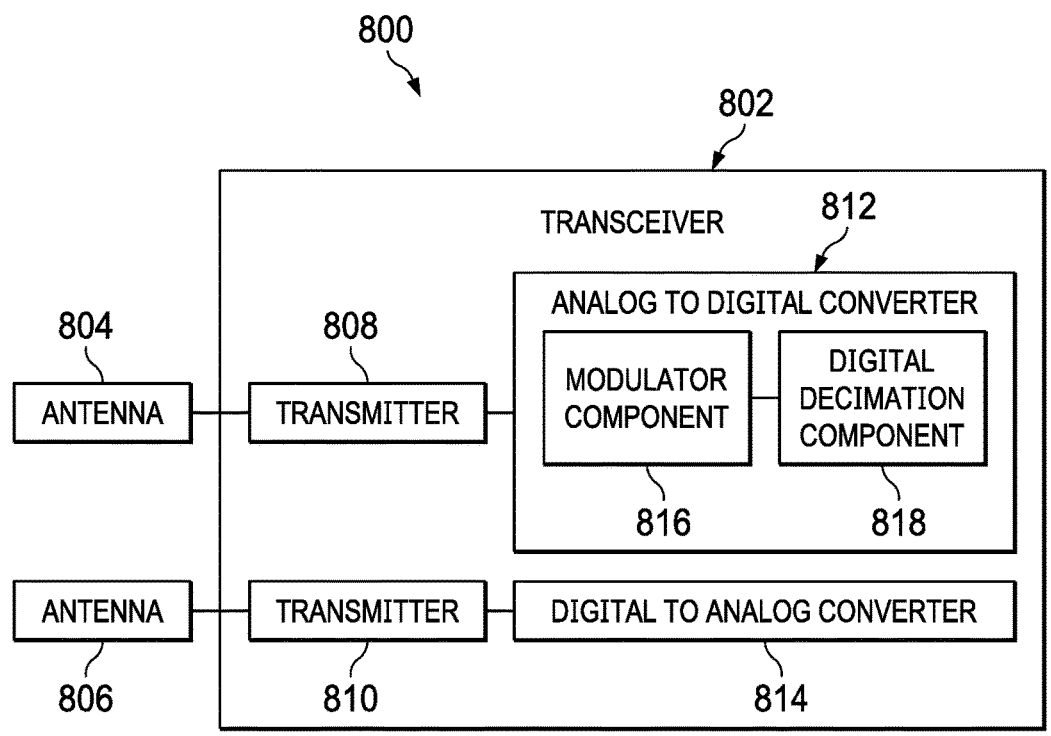
FIG. 8 illustrates a block diagram of a transceiver that includes an ADC that includes a modulator component with alternately updated DACs.

Referring to FIG. 8, a block diagram of a transceiver 800 is shown. The transceiver 800 includes a receiver 808 coupled to a first antenna 804 and to an ADC 812. The receiver 808 is configured to receive analog radio frequency (RF) signals through the first antenna 804. The ADC 812 includes a modulator component 816 that includes alternately updated DACs as described herein to reduce dynamic error, clock jitter, ELD, or a combination thereof. For example, the modulator component 816 may correspond to the modulator component 300 or the modulator component 600 described herein. The ADC 812 further includes a digital decimation component 818 configured to receive a first digital signal at sampling frequency fs from the modulator component 816 and to generate a second digital signal at output rate fd. To illustrate, the receiver 808 may receive the input analog signal 202 or the input analog signal 602 through the first antenna 804. The ADC 812 may receive then receive the input analog signal 202 or the input analog signal 602 from the receiver 808. The modulator component 816 of the ADC 812 may sample the input analog signal 202 or the input analog signal 602 at a rate of fs to generate the convert the digital signal 208 or the digital signal 614 as described herein. The digital decimation component 818 may then generate an output digital signal at the output rate fd based on the digital signal 208 or the digital signal 614.

The transceiver 802 further includes a transmitter 810 coupled to a second antenna 806 and to a DAC 814. In some implementations the antennas 804, 806 correspond to a single antenna. The DAC 814 is configured to convert digital signals (e.g., from a processing device or communication interface) into analog signals for transmission by the transmitter 810 via the second antenna 806. Thus, the transceiver 800 supports transmission and reception of wireless signals. In some implementations, the transceiver 800 corresponds to a fifth generation (5G) cellular network technology transceiver or other wireless communication transceiver.

Thus, FIG. 8 illustrates an example of a transceiver that includes an ADC modulator component that incorporates alternately updated DACs. Accordingly, the transceiver 802 may be less susceptible to dynamic error, clock jitter, ELD, or a combination thereof and digital signals generated by the transceiver may be more accurate.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims. For example, various embodiments may be combined. To illustrate, features of the modulator component 300 may be combined with the modulator component 600.

What is claimed is:

1. A modulator of an analog to digital converter, the modulator comprising:
   a quantizer component configured to generate a digital signal based on a clock input operating at a sample rate;
   a first digital to analog converter (DAC) configured to generate first DAC output at half the sample rate; and
   a second DAC configured to generate second DAC output at half the sample rate, wherein the first DAC and the second DAC are updated at alternate cycles of the clock input.

2. The modulator of claim 1, wherein the first DAC is configured to receive values of the digital signal generated by the quantizer in response to odd pulses of the clock input, and wherein the second DAC is configured to receive values of the digital signal generated by the quantizer in response to even pulses of the clock input.

3. The modulator of claim 1, wherein the quantizer is configured to generate the digital signal based on a filtered difference between an input analog signal and a combination of the first DAC output and the second DAC output.

4. The modulator of claim 3, further comprising a loop filter configured to generate the filtered difference.

5. The modulator of claim 4, wherein the loop filter includes an integrator.

6. The modulator of claim 1, wherein the first DAC is configured to generate the first DAC output to include pulses as wide as two pulses of the clock input, and wherein the second DAC is configured to generate the second DAC output to include pulses as wide as two pulses of the clock input.

7. The modulator of claim 1, further comprising:
   a first flip-flop device configured to receive a first portion of the digital signal from the quantizer, the first flip-flop device clocked by odd pulses of the clock input, wherein the first DAC is configured to generate the first DAC output based on a first signal received from the first flip-flop device; and
   a second flip-flop device configured to receive a second portion of the digital signal from the quantizer, the second flip-flop device clocked by even pulses of the clock input, wherein the second DAC is configured to generate the second DAC output based on a second signal received from the second flip-flop device.

8. The modulator of claim 7, wherein the quantizer includes:
   a first quantizer component clocked by the odd pulses of the clock input and configured to generate the first portion of the digital signal; and
   a second quantizer component by the even pulses of the clock input and configured to generate the second portion of the digital signal.

9. A modulator of an analog to digital converter, the modulator comprising:
   a quantizer component configured to generate a digital signal based on a clock input;
   a first digital to analog converter (DAC) configured to generate first DAC output including pulses as wide as two pulses of the clock input; and
   a second DAC configured to generate second DAC output including pulses as wide as two pulses of the clock input.

10. The modulator of claim 9, wherein the first DAC is configured to receive values of the digital signal generated by the quantizer in response to odd pulses of the clock input, and wherein the second DAC is configured to receive values of the digital signal generated by the quantizer in response to even pulses of the clock input.

11. The modulator of claim 9, wherein the quantizer is configured to generate the digital signal based on a filtered difference between an input analog signal and a combination of the first DAC output and the second DAC output.

12. The modulator of claim 11, further comprising a loop filter configured to generate the filtered difference.

13. The modulator of claim 12, wherein the loop filter includes an integrator.

14. The modulator of claim 9, further comprising:
a first flip-flop device configured to receive a first portion of the digital signal from the quantizer, the first flip-flop device clocked by odd pulses of the clock input, wherein the first DAC is configured to generate the first DAC output based on a first signal received from the first flip-flop device; and
a second flip-flop device configured to receive a second portion of the digital signal from the quantizer, the second flip-flop device clocked by even pulses of the clock input, wherein the second DAC is configured to generate the second DAC output based on a second signal received from the second flip-flop device.

15. The modulator of claim 14, wherein the quantizer includes:
a first quantizer component clocked by the odd pulses of the clock input and configured to generate the first portion of the digital signal; and
a second quantizer component by the even pulses of the clock input and configured to generate the second portion of the digital signal.

16. A transceiver comprising:
a receiver; and
an analog digital converter (ADC) coupled to the receiver, the ADC including:
a modulator component comprising:
a quantizer component configured to generate a digital signal based on a clock input operating at a sample rate;
a first digital to analog converter (DAC) configured to generate first DAC output at half the sample rate; and
a second DAC configured to generate second DAC output at half the sample rate, wherein the first DAC and the second DAC are updated at alternate cycles of the clock input.

17. The transceiver of claim 16, wherein the first DAC is configured to receive values of the digital signal generated by the quantizer in response to odd pulses of the clock input, and wherein the second DAC is configured to receive values of the digital signal generated by the quantizer in response to even pulses of the clock input.

18. The transceiver of claim 16, wherein the quantizer is configured to generate the digital signal based on a filtered difference between an input analog signal and a combination of the first DAC output and the second DAC output.

19. The transceiver of claim 18, wherein the modulator component further includes a loop filter configured to generate the filtered difference.

20. The transceiver of claim 16, wherein the first DAC is configured to generate the first DAC output to include pulses as wide as two pulses of the clock input, and wherein the second DAC is configured to generate the second DAC output to include pulses as wide as two pulses of the clock input.

21. A modulator of an analog to digital converter, the modulator comprising:
a quantizer component configured to generate a digital signal based on a clock input;
a first digital to analog converter (DAC) configured to receive input from a first exclusive or (XOR) device, the first XOR device receiving odd pulses of the clock input and odd values of the digital signal; and
a second DAC configured to generate second DAC configured to receive input from a second XOR device, the second XOR device receiving even pulses of the clock input and even values of the digital signal.

22. The modulator of claim 21, further comprising an integrator configured to generate an integrated signal based on a difference between output of a cascade of integrators and a sum of output of the first DAC and output of the second DAC, the quantizer configured to generate digital signal based on the integrated signal.

* * * * *